(12) United States Patent  
Sheik-Bahae

(10) Patent No.: US 8,720,219 B1  
(45) Date of Patent: May 13, 2014

(54) ALL SOLID STATE OPTICAL CRYOCOOLER USING INTRACAVITY OPTICALLY PUMPED SEMICONDUCTOR LASERS AND A METHOD OF MAKING THE SAME

(75) Inventor: Mansoor Sheik-Bahae, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 431 days.

(21) Appl. No.: 12/984,780

(22) Filed: Jan. 5, 2011

Related U.S. Application Data

(60) Provisional application No. 61/335,383, filed on Jan. 6, 2010.

(51) Int. Cl.
- *F25D 23/00* (2006.01)
- *F25B 21/00* (2006.01)
- *H01S 3/04* (2006.01)

(52) U.S. Cl.
USPC ................................ 62/264; 62/3.1; 372/34

(58) Field of Classification Search
USPC ............................. 62/3.1, 264; 372/34, 35, 36
See application file for complete search history.

(56) References Cited

U.S. PATENT DOCUMENTS

| | | | |
|---|---|---|---|
| 4,961,202 A * | 10/1990 | Chaffee | 372/100 |
| 5,615,043 A * | 3/1997 | Plaessmann et al. | 359/346 |
| 6,041,610 A * | 3/2000 | Edwards et al. | 62/264 |
| 6,370,180 B2 * | 4/2002 | Zenteno | 372/96 |
| 6,378,321 B1 * | 4/2002 | Epstein et al. | 62/264 |
| 6,654,391 B2 * | 11/2003 | Adams | 372/10 |
| 7,397,832 B2 * | 7/2008 | Dell'Acqua et al. | 372/39 |
| 7,627,017 B2 | 12/2009 | Sheik-Bahae | |
| 2007/0121689 A1 * | 5/2007 | Brown | 372/39 |
| 2008/0112452 A1 * | 5/2008 | Chakraborty et al. | 372/45.011 |

OTHER PUBLICATIONS

Seletskiy et al, Cooling of Yb:YLF using cavity enhanced resonant absorption, Proc. of SPIE vol. 6907 (2008).*

* cited by examiner

*Primary Examiner* — Brandon M Rosati  
*Assistant Examiner* — Elizabeth Martin  
(74) *Attorney, Agent, or Firm* — MH2 Technology Law Group, LLP

(57) ABSTRACT

A device and corresponding method for cooling electronics is disclosed. The device is an all-solid-state optical cryocooler and can include an optically pumped semiconductor laser (OPSL); a cavity configured to receive and control absorption of the optically pumped semiconductor laser, the cavity having a high reflection (HR) surface and an anti-reflection (AR) surface; and a doped crystal housed within the cavity, the doped crystal configured to cool in response to input of the optically pumped semiconductor laser. The method can include supplying an intracavity optically pumped semiconductor lasers to a doped crystal within a cavity; and configuring the cavity to include a high reflection (HR) surface and an anti-reflection (AR) surface, the HR surface and AR surface formed on or in connection with the doped crystal to increase pump light absorption at the crystal within the cavity.

20 Claims, 3 Drawing Sheets

ALL SOLID STATE OPTICAL CRYOCOOLER USING INTRACAVITY OPTICALLY PUMPED SEMICONDUCTOR LASERS AND A METHOD OF MAKING THE SAME

RELATED APPLICATIONS

This application claims priority from U.S. Provisional Patent Application Ser. No. 61/335,383, filed Jan. 5, 2010, which is hereby incorporated by reference in its entirety.

GOVERNMENT RIGHTS

The present invention was made with Government support under Contract Number FA 9550-04-1-0356 awarded by the Air Force Office of Scientific Research. The Government has certain rights in the invention.

FIELD OF THE INVENTION

This invention relates generally to cooling of electronic devices, and more particularly, laser cooling and, more specifically, to an all-solid-state cryocooler.

BACKGROUND OF THE INVENTION

Optical refrigeration can include laser excitation of rare-earth doped glass and crystal host material systems. In some systems, optical refrigeration can include use of ytterbium doped fluorozirconate glass (Yb:ZBLAN) or ytterbium doped yttrium lithium fluoride crystal (Yb:YLF). Potentially, a high purity semiconductor crystal (double heterostructure or multiple quantum wells) could also be used as the cooling material.

In an optical refrigeration system, a cooling cycle is based on conversion of low-entropy low-energy input photons of an optical field (e.g. laser) into an isotropic higher-energy spontaneous emission (fluorescence) photons. The excitation laser is red-shifted from a mean wavelength of the emitted fluorescence ($\lambda_f$). Following absorption, out of equilibrium excitation becomes thermalized within the ground and exited state manifolds of the rare-earth ion. This is accomplished by phonon absorption from lattice vibrations of a material host. Thermal quanta of energy kT are carried away from the host in a form of spontaneously emitted photons, thereby cooling the material.

Laser cooling of solids can be exploited to achieve an all-solid-state cryocooler 100 as conceptually depicted in FIG. 1. The cryocooler 100 will exhibit advantages of compactness, no vibrations, no moving parts or fluids, high reliability, and no need for cryogenic fluids. In general, the cryocooler 100 will include a housing 110 a cooling crystal 120 within the housing, high reflectivity mirrors 130 at opposing ends of the cooling crystal 120, and a laser source 140 directed at the crystal 120. The housing 110 confines the crystal 120 within a vacuum space 115, and a combination thermal link 150 and IR detector 160 enable transfer of the cooled crystal state and detection of the crystal temperature, respectively. A heat sink 170 surrounding or supporting the housing 110 can absorb heat released from the crystal 120. In FIG. 1, pump light is generated by the semiconductor diode laser 140 and carried to the mirrored cooler element 120 by an optical fiber. The laser enters the cooler element 120 through a pinhole 135 in one mirror 130 and is trapped by the mirrors 130 until it is absorbed. Isotropic fluorescence escapes the cooler element as shown by radiation lines 125 and is absorbed by the vacuum casing. A sensor or other load is connected in the shadow region of the second mirror Space-borne infrared sensors can benefit from an all-solid-state cryocooler, as will other applications requiring compact cryocooling. In many potential applications, requirements on pump lasers are not very restrictive. The spectral width of the pump light has to be narrow compared to the thermal spread of the fluorescence. A multimode, fiber coupled laser with spectral widths of several nanometers would be sufficient. In an optical refrigerator, the cooling power is on the order of one percent of the pump laser power. For micro-cooling applications, with mW heat lift, only modest lasers are needed. For larger heat lifts, correspondingly more powerful lasers are needed. In all cooling applications, the cooling element has to be connected to the device being cooled, the load, by a thermal link. This link can siphon heat from the load while preventing the waste fluorescence from hitting the load and heating it.

It will be expected that any increase in cooling capacity of a crystal based cryocooler will require an increase in pump laser power, and a corresponding increase in size and complexity of, for example, the cryocooler 100 depicted in FIG. 1.

These challenges can be been dealt with herein, using a combination of optically-pumped semiconductor lasers (OPSL) together with an intracavity enhancement method to construct a compact optical cryocooler, as will be described in connection with the exemplary embodiments that follow.

SUMMARY

According to exemplary embodiments, an all-solid-state optical cryocooler is disclosed. The all-solid-state optical cryocooler can include an optically pumped semiconductor laser (OPSL); a cavity configured to receive and control absorption of the optically pumped semiconductor laser, the cavity comprising a high reflection (HR) surface and an anti-reflection (AR) surface; and a doped crystal housed within the cavity, the doped crystal configured to cool in response to input of the optically pumped semiconductor laser.

In addition, according to exemplary embodiments, a method of making an all-solid-state optical cryocooler is disclosed. The method can include supplying an intracavity optically pumped semiconductor lasers to a doped crystal within a cavity; and configuring the cavity to include a high reflection (HR) surface and an anti-reflection (AR) surface, the HR surface and AR surface formed on or in connection with the doped crystal to increase pump light absorption at the crystal within the cavity.

DETAILED DESCRIPTION

As described herein, exemplary embodiments allow for laser cooling to cryogenic temperatures by cooling a Ytterbium doped Yttrium Lithium Fluoride (Yb:YLF) to 155K from ambient temperature or 300K. (Note: 155K is our current experimental record; the potential (and our goal) however is to achieve much lower temperatures, i.e. to 100K and below). These embodiments represent the realization of an all-solid-state cryocooler, breaking the temperature barrier of 170K attained by previous methods (e.g., multi-stage standard thermo-electric (TE) coolers or Peltier coolers). The exemplary embodiments of the present invention include the combination of optically-pumped semiconductor lasers (OPSL) together with an intracavity enhancement method to construct a compact optical cryocooler. Those of skill in the art will appreciate that the following description is related to preferred and/or example embodiments of the present invention, and that the scope of the present invention is defined exclusively within the appended claims. For certain embodiments, which can be applied as a compact, lightweight and portable device, it is important to integrate an efficient laser source with an optical cavity that can enhance the absorption process. Exemplary embodiments are depicted in FIGS. 2 and 3 below.

Figure 1:
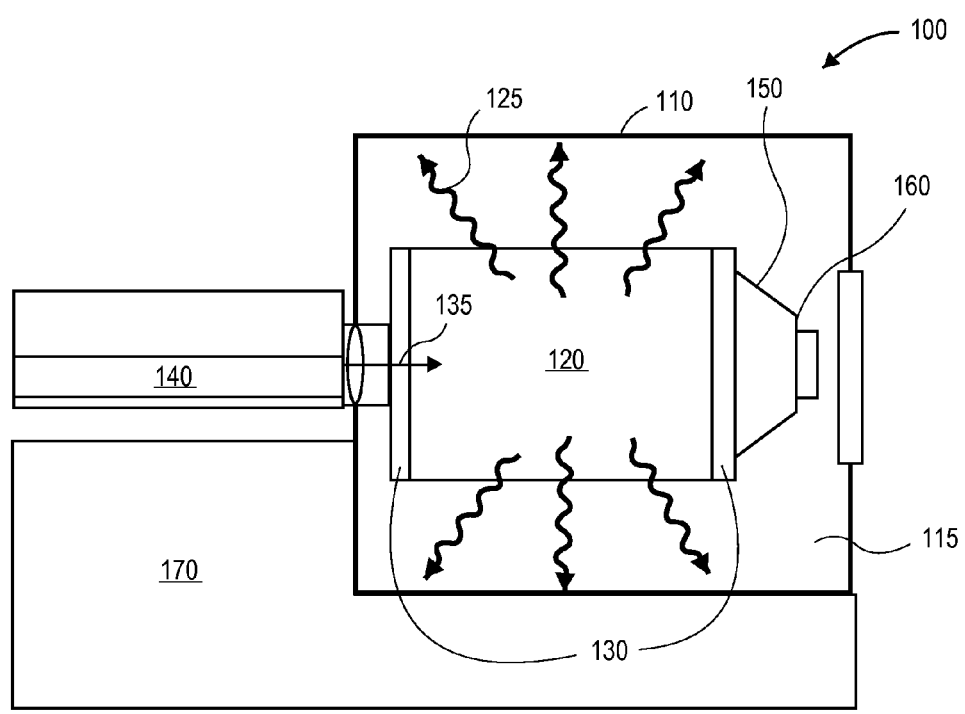
FIG. 1 shows a schematic of a prior optical refrigeration system.
Figure 2:
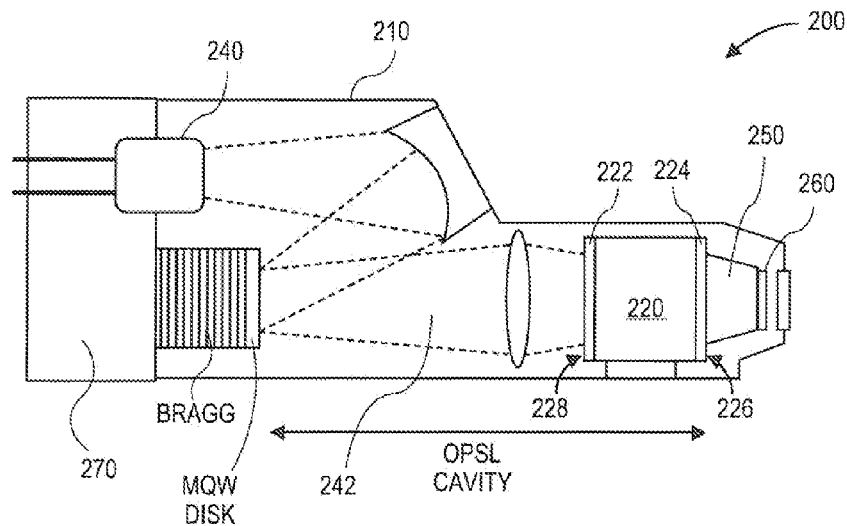
FIG. 2 shows an optical refrigeration system according to an exemplary embodiment herein.
Figure 3:
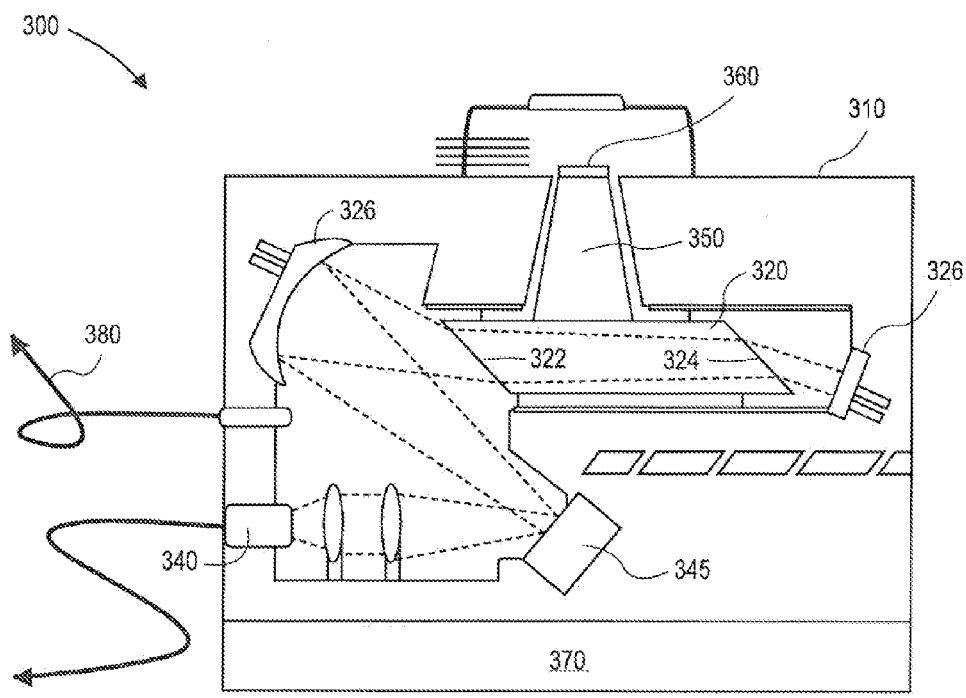
FIG. 3 shows an optical refrigeration system according to an exemplary embodiment herein.

FIG. 2 shows an optical refrigeration system according to an exemplary embodiment herein. It should be readily apparent to one of ordinary skill in the art that the illustration of FIG. 2 represents a generalized schematic illustration and that other components can be added or existing components can be removed or modified.

In general, FIG. 2 depicts an exemplary embodiment of an optical cryocooler 200 wherein a semiconductor thin-disk laser or optically pumped semiconductor laser (OPSL) cavity can be constructed using a standard technique with Bragg mirrors and attached to a heat sink.

The optical cryocooler 200 of FIG. 2 can include an outer structure 210 housing a cooling crystal 220. A pump laser 240 can be used to excite the cooling crystal 220. The pump laser 240 can be mounted on a heat sink 270. The semiconductor thin disk laser or OPSL cavity can be constructed using a "standard technique" (i.e., with Bragg mirrors and attached to or otherwise mounted on a heat sink. The cooling crystal 220 can, for purposes of explanation, be considered to include an input end 222 into which the pump laser is directed, and a distal end 224 at which the pump laser terminates. Typically, the passage of the laser is along an optical axis of the cooling crystal 220. The cooling crystal 220 can be configured with a high reflection (HR) surface 226 at the distal end 224 of the crystal and an anti-reflection (AR) surface 228 at the input end 222 of the crystal 220. The positioning of the HR surface 226 and the AR surface 228 is to minimize unwanted cavity losses. Depending on the absorption of the crystal (which is related to the doping concentration and the temperature), the length of the crystal can be chosen to maximize the absorbed power. This optimization also depends on the total pump power. The HR surface 226 and the AR surface 228 can include one or more lenses positioned at opposing ends of the crystal 220. The HR surface 226 and the AR surface 228 can include convex surfaces formed integrally with or on the opposing ends of the crystal 220.

The stability of the cavity can be ensured by several methods, including inserting a lens inside (as shown) or polishing surfaces of the cooling crystal (or glass) into convex lenses. The cooling power of the optical cryocooler 200 can be scaled with higher power diode pump lasers and/or by using multiple semiconductor disks inside the cavity. Further, embodiments can add fluorescence recycling by harvesting the fluorescence from the cooling crystal by coating the inside of the crystal housing by high efficiency photovoltaic cells.

The optical cryocooler 200 of FIG. 2 can therefore use the efficient edge-emitting high power laser diode 240 (20-100 W) to pump a semiconductor thin disk multiple-quantum-well (MQW) laser 242 that can be designed to have a lasing wavelength, λ, coinciding with the lowest transition in the Stark manifold of the rare-earth doped crystal to be cooled. For example, Yb:YLF crystal corresponds to λ=1020 nanometers (nm) which is associated with the E4-E5 transition. The MQW laser system, in certain embodiments, can be fabricated from indium gallium arsenide (i.e. "InGaAs"). The system can include a diode-pumped laser which can be, for example, the commercially available 980 nm InGaAs laser.

FIG. 3 shows an optical refrigeration system 300 according to an exemplary embodiment herein. It should be readily apparent to one of ordinary skill in the art that the illustration of FIG. 3 represents a generalized schematic illustration and that other components can be added or existing components can be removed or modified.

The optical cryocooler 300 of FIG. 3 can include an outer structure 310 housing a cooling crystal 320. In FIG. 3, the cooling crystal 320 can be cut at Brewster angles (at both ends 322, 324) to eliminate reflection losses. This eliminates the need for AR coatings on the cooling crystal as used in FIG. 2. A pump laser 340 can be used to excite the cooling crystal 320. The pump laser 340 can be mounted on or proximate a heat sink 370. The heat sink 370 can be configured in order to absorb heat output from the cooling crystal 320. Typically, the passage of the laser is along an optical axis of the cooling crystal 320.

By separating the HR mirrored surface separate from (i.e. not attached to) the cooling crystal 320, introduction of further parasitic heating to the cooling crystal 320 is avoided. The positioning of the HR surfaces 326 minimize unwanted cavity losses. Depending on the absorption of the crystal (which is related to the doping concentration and the temperature), the length of the crystal can be chosen to maximize the absorbed power. The HR surfaces 326 can include mirrored surfaces. The HR surfaces 326 can include a convex surface.

The stability of the cavity can be ensured by several methods, including inserting a lens inside (as shown in FIG. 3) or polishing surfaces of the cooling crystal (or glass) into convex lenses. The cooling power of the optical cryocooler 300 can be scaled with higher power diode pump lasers and/or by using multiple semiconductor disks 345 inside the cavity. Further, embodiments can add fluorescence recycling by harvesting the fluorescence from the cooling crystal by coating the inside of the crystal housing by high efficiency photovoltaic cells.

A thermal link 350 can be attached on the side (rather than at the end) of the cooling crystal 320. Further, a spectrum monitoring fiber 380 can be part of all of the embodiments: it is used to measure the temperature (from fluorescence) for feedback control.

Alternative embodiments can also include methods of evanescent-coupled subcavity which can be used to further alleviate the thermal issues. Appropriate thermal management for OPSL can be accomplished in various ways, including a standard diamond heat spreader or by using a technique patented by this author in U.S. Pat. No. 7,627,017B2, the contents of which are incorporated by reference in its entirety herein. The OPSL cavity of the exemplary embodiments can be formed by coating a rare-earth doped crystal (to be cooled) with a high-reflection (HR) coating on one side and an anti-reflection (AR) coating on the other.

Further, exemplary embodiments can include a thermal link 250/350 which can be attached to a HR surface. A cold finger 260/360 can be attached to the end of the thermal link opposite the HR surface. In certain embodiments, the gain medium, the pump power and the absorption of the cooling element (crystal) can be optimized for maximum cooling power according to standard-intracavity processes. The cooling power of the exemplary embodiments can be scaled with higher power diode pump lasers and/or by using multiple semiconductor disks inside the cavity. Finally, embodiments can add fluorescence recycling by harvesting the fluorescence from the cooling crystal by coating the inside of the crystal housing by high efficiency photovoltaic cells.

The optical cryocooler devices of FIGS. 2 and 3 are therefore configured to utilize and demonstrate the Stark manifold resonances in doped crystals. It will be appreciated that the configuration is exemplary only, and that doped crystals, configured to resonate at a Stark manifold resonance capable of cooling the crystal to a temperature of 110K from about 170K, can be incorporated into the exemplary cryocoolers 200, 300. However, these embodiments are not limited by YLF crystal; rather the described concepts can be applied to any crystal host, exhibiting such levels. Embodiments can utilize the excitation of the Stark manifold resonances so cryogenic operation, for even modest purity samples, can be achieved. Temperatures of, i.e. 77K, can be reached with an all-solid-state cryocooler, based on, for example, a Yb:YLF host, pumped in the E4-E5 transition. The Yb doped YLF crystal can be used in applications for airborne and space-borne sensors. An optical refrigeration or solid state optical refrigeration device using the disclosed technology offers many advantages over currently used, bulky mechanical coolers because it can be configured in a device which is vibration free, compact, lightweight and agile.

Figure 4:
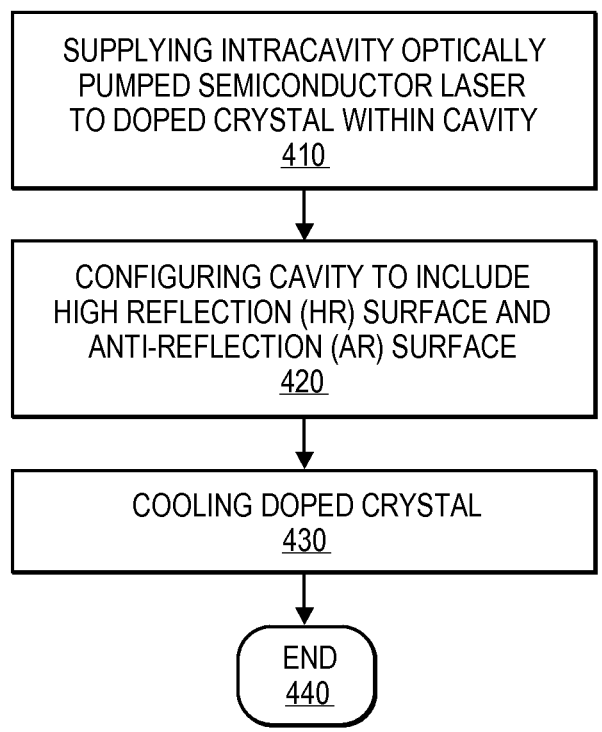
FIG. 4 shows a method of making an all-solid-state optical cryocooler.

FIG. 4 is directed to a method 400 for cooling electronics. It should be readily apparent to one of ordinary skill in the art that the method of FIG. 4 represents a generalized schematic illustration and that other steps can be added or existing steps can be removed or modified.

In particular, FIG. 4 is directed to a method 400 of making an all-solid-state optical cryocooler.

The method can include supplying an intracavity optically pumped semiconductor lasers to a doped crystal within a cavity at 410. The method can further include configuring the cavity to include a high reflection (HR) surface and an anti-reflection (AR) surface at 420. The HR surface and AR surface can be formed on or in connection with the doped crystal to increase pump light absorption at the crystal within the cavity. At 430, the doped crystal can be cooled to a temperature of from about 110K to about 170K. The method can conclude at 430.

In the above embodiments, it will be appreciated that the applicable environment can include any industrial cooling and heating devices, for example, a heat exchanger, steam generator, waste heat recovery device, high temperature equipment, military and aerospace hardware, refrigeration, and similar devices that include liquids such as water and refrigerant.

It will be apparent to those skilled in the art that various modifications and variations can be made in the devices and methods of various embodiments of the invention. Other embodiments will be apparent to those skilled in the art from consideration of the specification and practice of the embodiments disclosed herein. It is intended that the specification and examples be considered as examples only. The various embodiments are not necessarily mutually exclusive, as some embodiments can be combined with one or more other embodiments to form new embodiments. The current configuration discussed is one embodiment. Other possible embodiments are envisioned and include, but are not limited to enhanced nucleate boiling and immersion cooling of electronic devices.

It is noted that, as used in this specification and the appended claims, the singular forms "a," "an," and "the," include plural referents unless expressly and unequivocally limited to one referent. Thus, for example, reference to "a wavelength" includes two or more different wavelengths. As used herein, the term "include" and its grammatical variants are intended to be non-limiting, such that recitation of items in a list is not to the exclusion of other like items that can be substituted or other items that can be added to the listed items.

What is claimed is:

1. An all-solid-state optical cryocooler comprising:
an outer structure;
a high reflection (HR) surface and an anti-reflection (AR) surface disposed within the outer structure;
an optically pumped semiconductor laser (OPSL) disposed within the outer structure; and
a doped crystal disposed within the outer structure, the doped crystal configured to cool in response to input of the optically pumped semiconductor laser.

2. The device of claim 1, further comprising a thermal link configured to transfer thermal load away from a cooled doped crystal to a device to be cooled.

3. The device of claim 1, further comprising a heat sink connected to the outer structure.

4. The device of claim 1, wherein the doped crystal comprise an HR surface at a distal end and an AR surface at a near end relative to an original input of the optically pumped semiconductor laser.

5. The device of claim 1, wherein each of the HR surface and AR surface comprises an HR and AR coating material, respectively.

6. The device of claim 1, wherein each of the HR surface and AR surface comprises an HR and AR mirror, respectively.

7. The device of claim 1, wherein positioning of the HR surface and AR surface increase an interaction length in a non-resonant laser cavity.

8. The device of claim 1, wherein the positioning of the HR surface and AR surface increase pump light absorption in a resonant laser cavity.

9. The device of claim 1, wherein the OPSL comprises an edge emitting high power laser diode which pumps a semiconductor thin disk multiple-quantum-well (MQW) laser configured to have a lasing wavelength λ coinciding with the lowest transition in a Stark manifold of the doped crystal.

10. The device of claim 9, wherein the laser diode is pumped at about 20 to about 100 W.

11. The device of claim 1, wherein the doped crystal comprises a yttrium lithium fluoride (YLF) doped ytterbium (Yb) crystal comprising a wavelength of 1020 nm corresponding to an E4-E5 transition.

12. The device of claim 9, wherein the MQW laser system is fabricated from indium gallium arsenide (InGaAs).

13. The device of claim 1, wherein the laser comprises a diode pumped 980 nm indium gallium arsenide (InGaAs) laser.

14. The device of claim 1, further comprising an optical fiber configured to deliver the diode-pumped laser to the outer structure.

15. The device of claim 1, wherein opposing ends of the crystal are configured as convex lenses.

16. The device of claim 1, further comprising convex lenses at opposing ends of the doped crystal.

17. The device of claim 1, further comprising a thermal link attached to the HR surface.

18. The device of claim 17, further comprising a cold finger attached to an end of the thermal link opposite the HR surface.

19. A method of making an all-solid-state optical cryocooler comprising:
  supplying laser from an optically pumped semiconductor laser system disposed within an outer structure to a doped crystal disposed within the outer structure and configured to cool in response to the laser radiation; and
  configuring the to include a high reflection (HR) surface and an anti-reflection (AR) surface disposed within the outer structure, the HR surface and AR surface formed on or in connection with the doped crystal to increase pump light absorption at the crystal.

20. The device of claim 1, further comprising photovoltaic cells for harvesting fluorescence from the cooling crystal.

\* \* \* \* \*

UNITED STATES PATENT AND TRADEMARK OFFICE
CERTIFICATE OF CORRECTION

Page 1 of 1

PATENT NO. : 8,720,219 B1
APPLICATION NO. : 12/984780
DATED : May 13, 2014
INVENTOR(S) : Mansoor Sheik-Bahae It is certified that error appears in the above-identified patent and that said Letters Patent is hereby corrected as shown below:

In the Claims

Column 7, lines 1-11 should read

19. A method of making an all-solid-state optical cryocooler comprising: supplying laser from an optically pumped semiconductor laser system disposed within an outer structure to a doped crystal disposed within the outer structure and configured to cool in response to the laser radiation; and configuring the <u>outer structure</u> to include a high reflection (HR) surface and an anti-reflection (AR) surface disposed within the outer structure, the HR surface and AR surface formed on or in connection with the doped crystal to increase pump light absorption at the crystal.

Signed and Sealed this
Sixteenth Day of September, 2014

Michelle K. Lee
*Deputy Director of the United States Patent and Trademark Office*